(12) United States Patent
Matsui et al.

(10) Patent No.: US 9,671,583 B2
(45) Date of Patent: Jun. 6, 2017

(54) OPTICAL TRANSCEIVER HAVING PLUG BOARD INDEPENDENT OF CIRCUIT BOARD AND A HOLDER THAT HOLDS THE CIRCUIT BOARD ON A LEVEL WITH THE PLUG BOARD

(71) Applicant: Sumitomo Electric Industries, Ltd., Osaka-shi (JP)

(72) Inventors: Takashi Matsui, Yokohama (JP); Hiromi Kurashima, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/712,283

(22) Filed: May 14, 2015

(65) Prior Publication Data

US 2015/0338588 A1 Nov. 26, 2015

(30) Foreign Application Priority Data

May 20, 2014 (JP) ................................. 2014-104337

(51) Int. Cl.
*G02B 6/42* (2006.01)
*H05K 3/34* (2006.01)

(52) U.S. Cl.
CPC ........... *G02B 6/4261* (2013.01); *G02B 6/428* (2013.01); *G02B 6/4278* (2013.01); *H05K 3/3421* (2013.01); *H05K 2203/043* (2013.01); *Y10T 29/4913* (2015.01)

(58) Field of Classification Search
CPC .... G02B 6/428; G02B 6/4278; G02B 6/4261; H05K 3/3421
USPC ................. 385/14, 24, 88–90, 131–135, 147
See application file for complete search history.

(56) References Cited

U.S. PATENT DOCUMENTS

| | | | | |
|---|---|---|---|---|
| 5,519,586 A * | 5/1996 | Byrd | ..................... | H01H 85/202 361/796 |
| 6,139,368 A * | 10/2000 | Bogese, II | ......... | H01R 13/7195 439/620.09 |
| 6,179,627 B1 * | 1/2001 | Daly | ................... | H01R 13/6658 439/354 |
| 6,402,393 B1 * | 6/2002 | Grimes | ................ | G02B 6/4292 385/56 |
| 7,090,509 B1 * | 8/2006 | Gilliland | .............. | G02B 6/4292 385/92 |
| 2011/0103797 A1 * | 5/2011 | Oki | ...................... | G02B 6/4201 398/79 |
| 2013/0022360 A1 * | 1/2013 | Matsui | ................. | G02B 6/4201 398/116 |

FOREIGN PATENT DOCUMENTS

JP 2011-232702 A 11/2011

* cited by examiner

*Primary Examiner* — Akm Enayet Ullah
(74) *Attorney, Agent, or Firm* — Venable LLP; Michael A. Sartori; F. Brock Riggs

(57) ABSTRACT

An optical transceiver that provides a plug board independent of a circuit board is disclosed. The optical transceiver further includes a holder to hold both of the plug board and the circuit board in respective positions. The holder provides a first support to support the plug board in a side thereof, and a second support to support the circuit board in a side thereof. Because the holder supports the plug board and the circuit board in respective sides thereof, the holder does not reduce a space for mounting electronic circuit on the circuit board and not interfere with the function of the plug board.

7 Claims, 11 Drawing Sheets

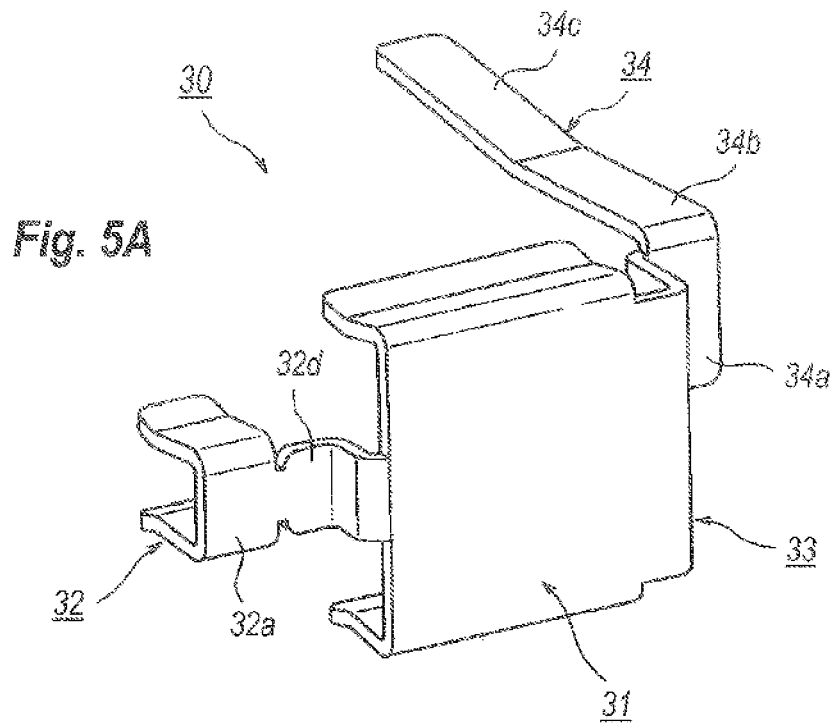
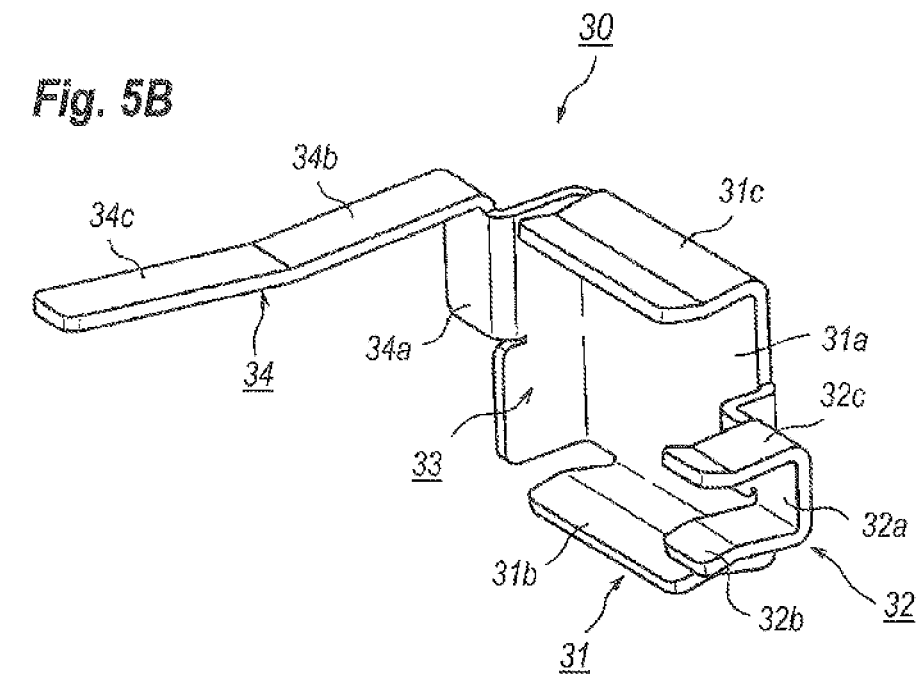

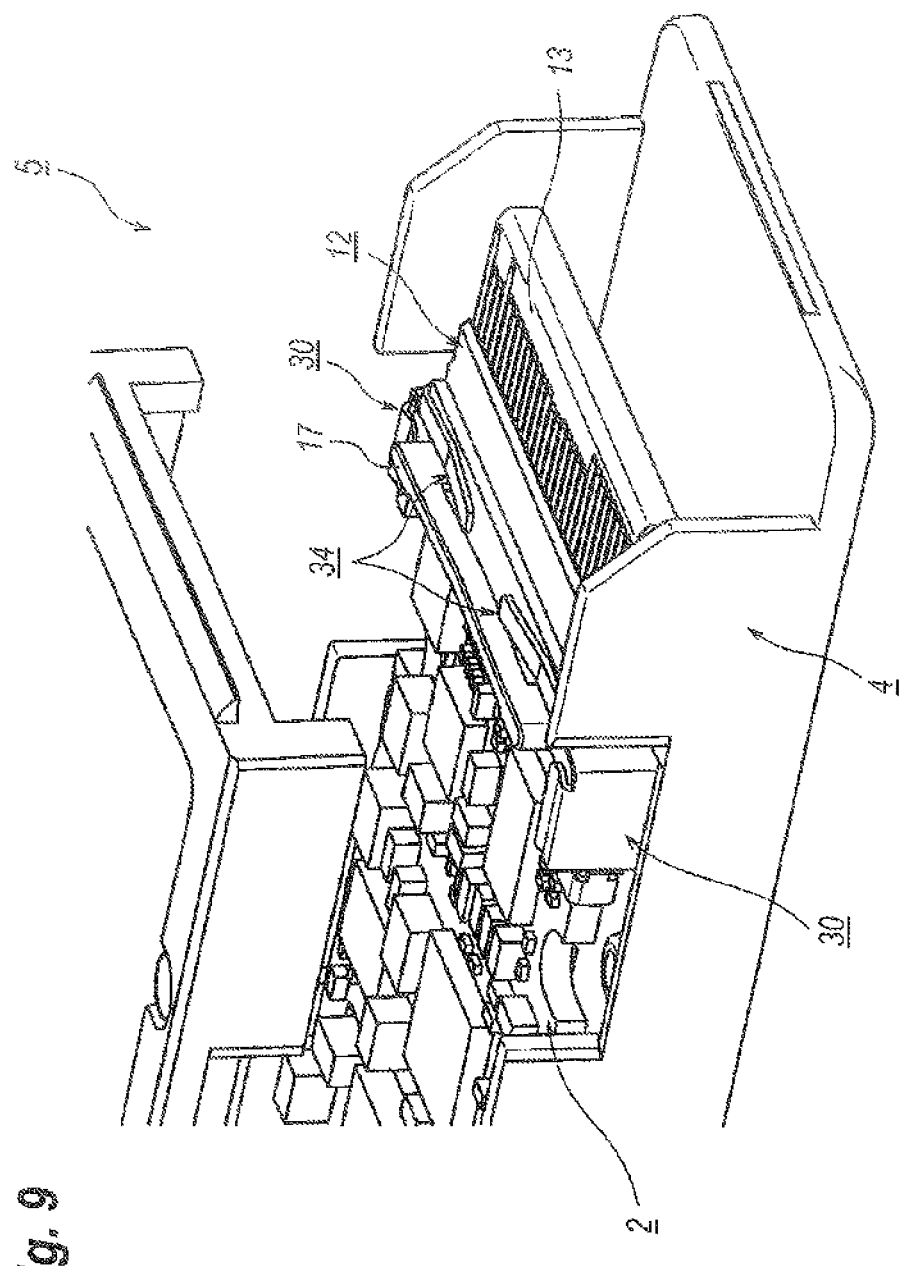

OPTICAL TRANSCEIVER HAVING PLUG BOARD INDEPENDENT OF CIRCUIT BOARD AND A HOLDER THAT HOLDS THE CIRCUIT BOARD ON A LEVEL WITH THE PLUG BOARD

BACKGROUND

Field

The present application relates to an optical transceiver, in particular, the application relates to an optical transceiver implementing with a circuit board mounting electronic circuits and a plug board electrically coupling the electronic circuits on the circuit board with a host system, where the plug board is physically independent of the circuit board.

Related Background Art

One type of multi-source-agreements (MSA) has defined that the circuit board for mounting electronic circuits is independent of a plug board having an electronic plug to couple with a connector prepared in the host system to communicate with the host system, because, as functions requested for the optical transceiver becomes complex and power consumption of the transceiver increases, the count of lead pins provide in the plug and the connector increases, and sometimes exceeds one hundred. The accuracy of the physical dimension required for such a plug and a connector enhances. When an optical transceiver installs such a precisely formed plug board integrated with a circuit board unnecessary for such fine dimensions, the cost of the optical transceiver becomes high. In another application, an optical transceiver is requested that a plug board thereof is made of resin to secure high frequency performance thereof. In such an application, the plug board is inevitable to be independent of the circuit board. Accordingly, advanced optical tranceivers usable in applications where a huge capacity of information is transmitted in extremely high speed often provide the plug board independent of the circuit board.

However, when two boards have respective thicknesses, that is, the plug board is necessary to have a thickness fit to the optical connector in the host system, the dimensions of the plug board are strictly and precisely determined in the MSA to secure the coupling between the plug in the optical transceiver and the connector in the host system, while, the circuit board is likely to be formed thinner because of the material cost, and the assembly of the plug board with the circuit board becomes complex. In particular, when two boards are assembled by the reflow soldering, two boards are necessary to be held in a level. When two boards are assembled in imbalance, namely, assembled in a tilted angle, the process to install two boards within the housing may cause stresses to the boards.

SUMMARY

One aspect of the present application relates to an optical transceiver plugged in an optical connector provided in a host system. The optical transceiver comprises a circuit board, a plug board, a holder, and housing. The circuit board mounts an electronic circuit thereon. The plug board, which is to be mated with the optical connector of the host system, is assembled with the circuit board by soldering. The holder holds the circuit board on a level with the plug board. The housing installs the circuit board and the plug board therein. A feature of the optical transceiver of the present application is that the plug board is made of resin, and the holder provides a first support for supporting the plug board and a second support for supporting the circuit board. The first support provides a top cramp and a bottom cramp putting a side of the plug board therebetween, while, the second support provides a top cramp and a bottom cramp putting a side of the circuit board therebetween.

Another aspect of the preset application relates to a method to assemble an optical transceiver that provides a circuit board and a plug board independent of the circuit board but assembled with the circuit board by soldering a plurality of lead pins with pads provided in the circuit board. The method comprises steps of holding the plug board by a first support of a holder and the circuit board by a second support of the holder; setting the circuit board on a level with the plug board; and fixing the lead pins to the pads by the reflux soldering.

BRIEF DESCRIPTION OF THE DRAWINGS

These and other aspects of the invention may be understood by reference to the following detailed description, taken in conjunction with the accompanying drawings, wherein:

FIG. 5A and FIG. 5B show a holder to hold the circuit board and the plug board;

FIG. 9 describes the shielding mechanism around the holder;

DETAILED DESCRIPTION

Next, some embodiments of the optical transceiver according to the present application will be described as referring to drawings. In the explanation of the drawings, numerals or symbols same with or similar to each other will refer to elements same with or similar to each other without duplicated explanations.

Figure 1:
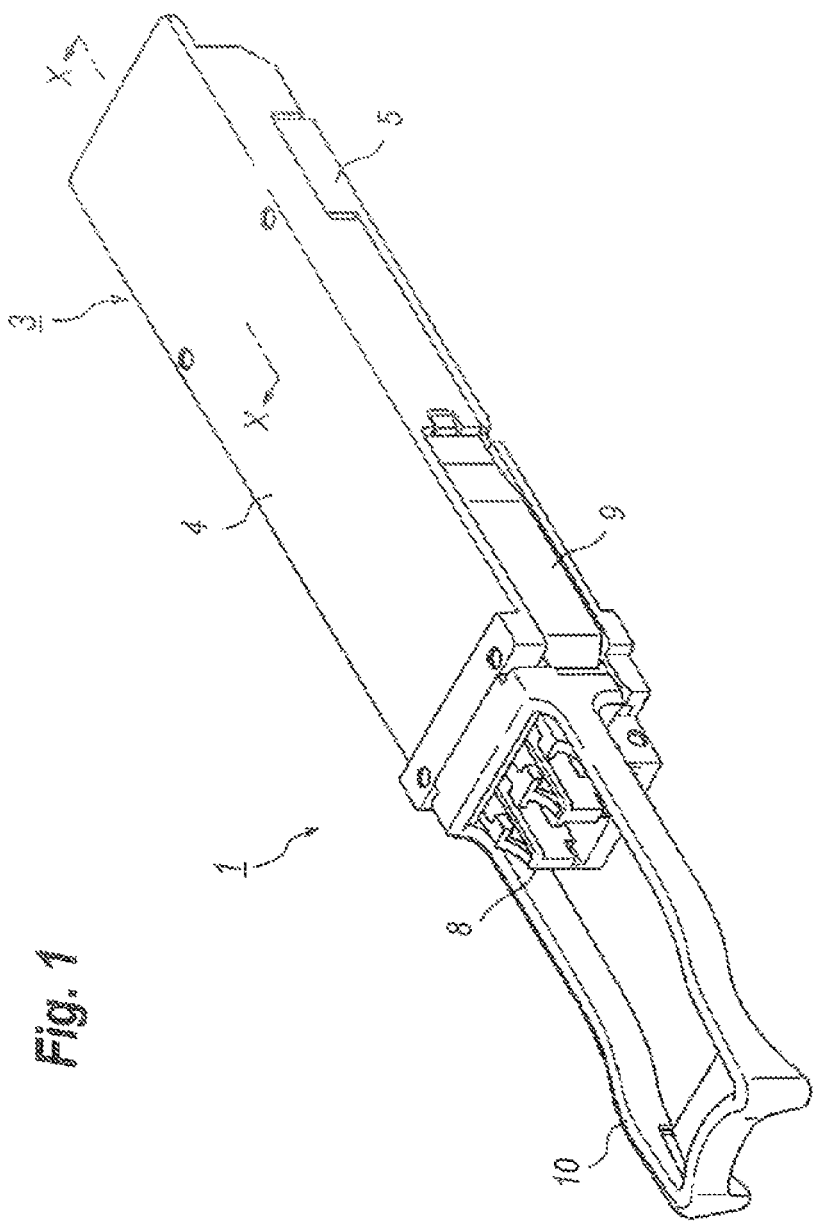
FIG. 1 shows an outer appearance of an optical transceiver according to an embodiment of the present invention.

FIG. 1 shows an outer appearance of an optical transceiver according to an embodiment of the present invention. The optical transceiver 1, which is installed on a mother board of the host system, may transmit and/or receive optical signals. The optical transceiver 1 shown in FIG. 1 is a type of, what is called, the hot pluggable optical transceiver where the optical transceiver 1 is plugged within a cage prepared in the host system without power down the system.

As shown in FIG. 1, the optical transceiver 1 has a housing 3 made of metal, typically zinc and/or aluminum, including a top housing 4 and a bottom housing 5. Both housings, 4 and 5, form a space within which optical components, electrical components, a circuit board, and a plug board are installed. Two boards will be described later in detail.

Figure 2:
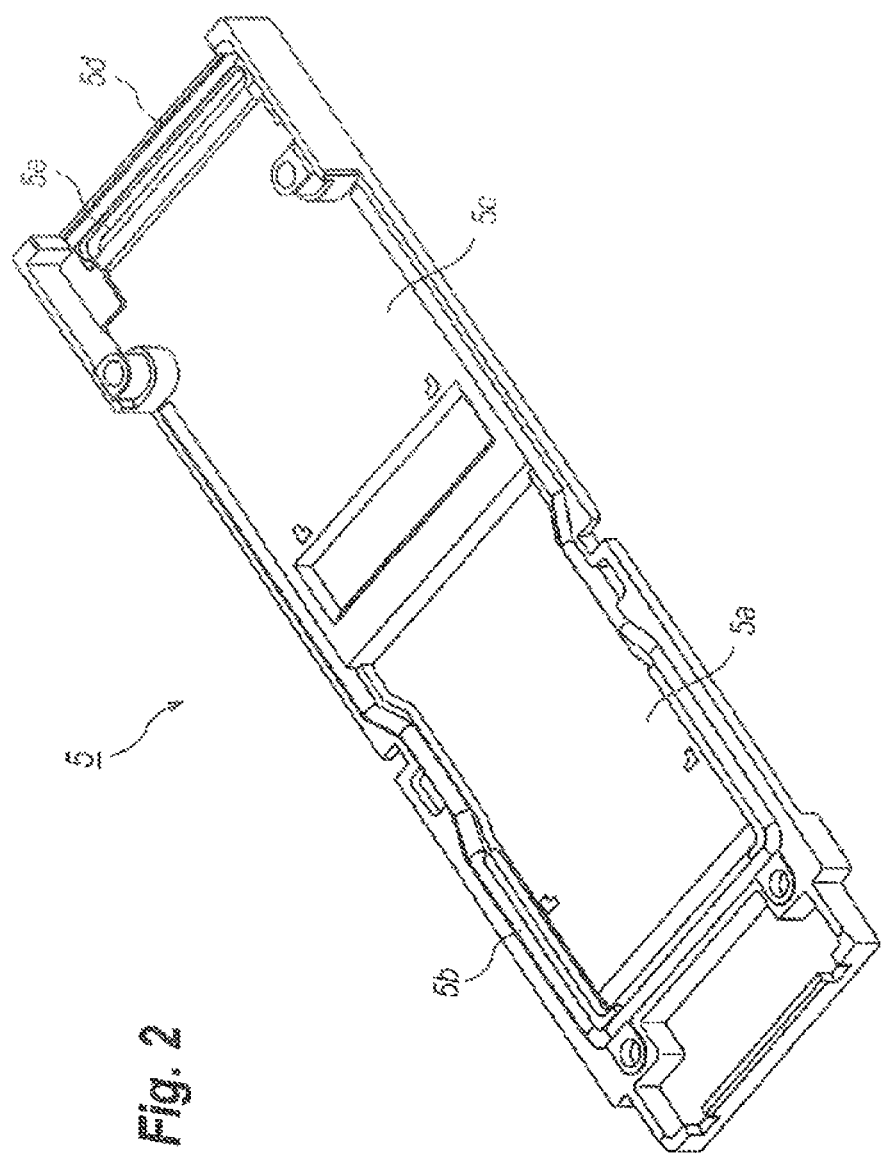
FIG. 2 is a perspective view of a bottom housing of the optical transceiver shown in FIG. 1.

FIG. 2 is a perspective view of the bottom housing 5, where FIG. 2 removes the optical receptacle 8, the pull-tab 10, the top housing 4 and so on. The bottom housing 5 includes a from portion 5a and a rear portion 5c, where the front portion 5a installs transducers, such as a transmitter optical sub-assembly (TOSA) and/or a receiver optical sub-assembly (ROSA), to convert signals between an electrical from and an optical form. The rear portion 5c installs electronic circuits on the circuit board. The explanation below assumes that the direction "front" or "forward" corresponds to a side where the optical receptacle is provided, while, the direction "back" or "rear" corresponds to another side where the plug board is provided. However, these directions of "front" and "rear" are only for the explanation sake and not influence the scope of claims at all. A shield gasket 5b surrounds the front and rear portions, 5a and 5c, to electro-statistically shield the portions, 5a and 5c. The bottom housing 5 further provides a cut or a rear opening 5d behind the rear portion 5c. The opening 5d exposes the plug board 12 therethrough. The opening 5d accompanies with a recess 5e.

Figure 3:
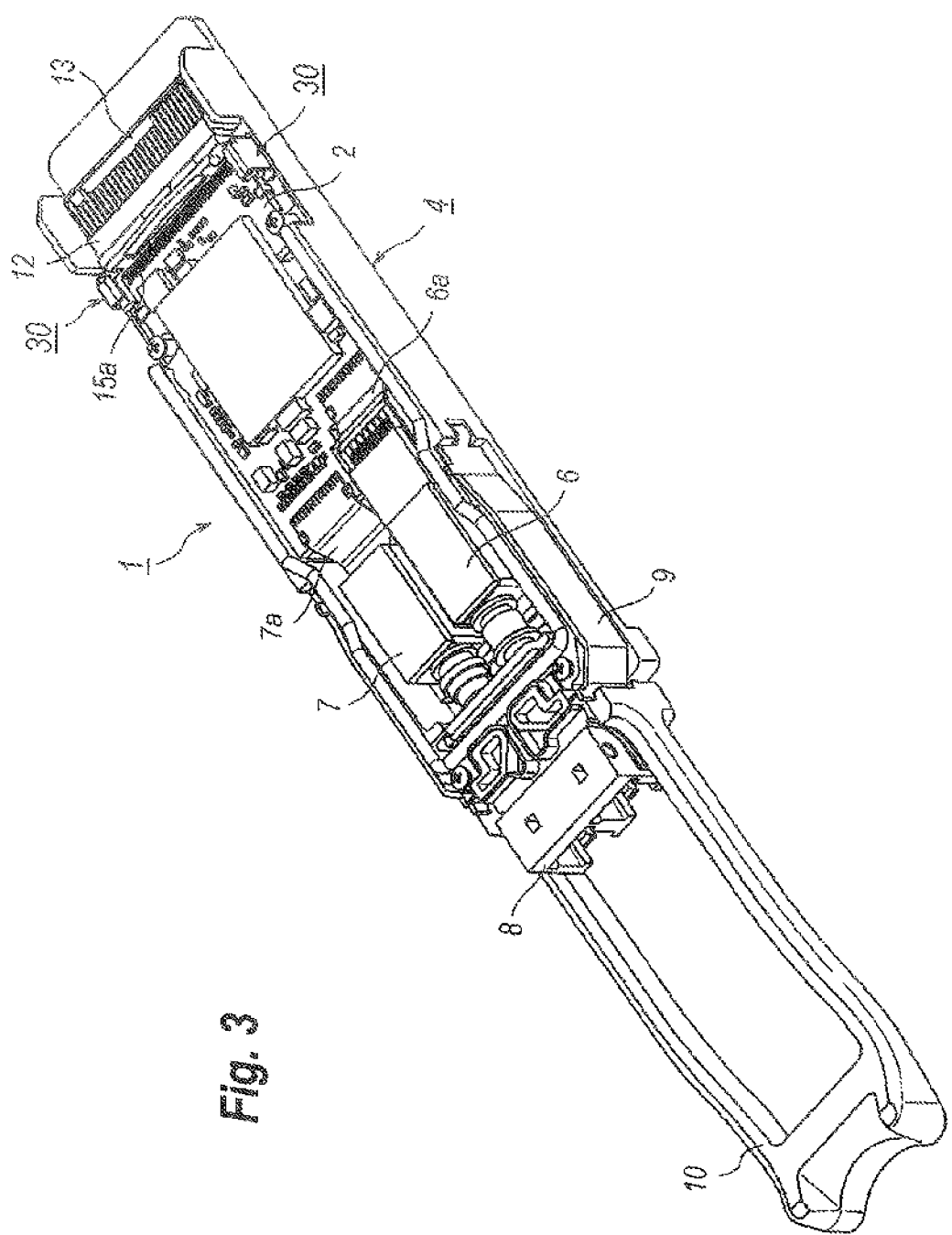
FIG. 3 is a perspective view showing an inside of the optical transceiver shown in FIG. 1.
Figure 4:
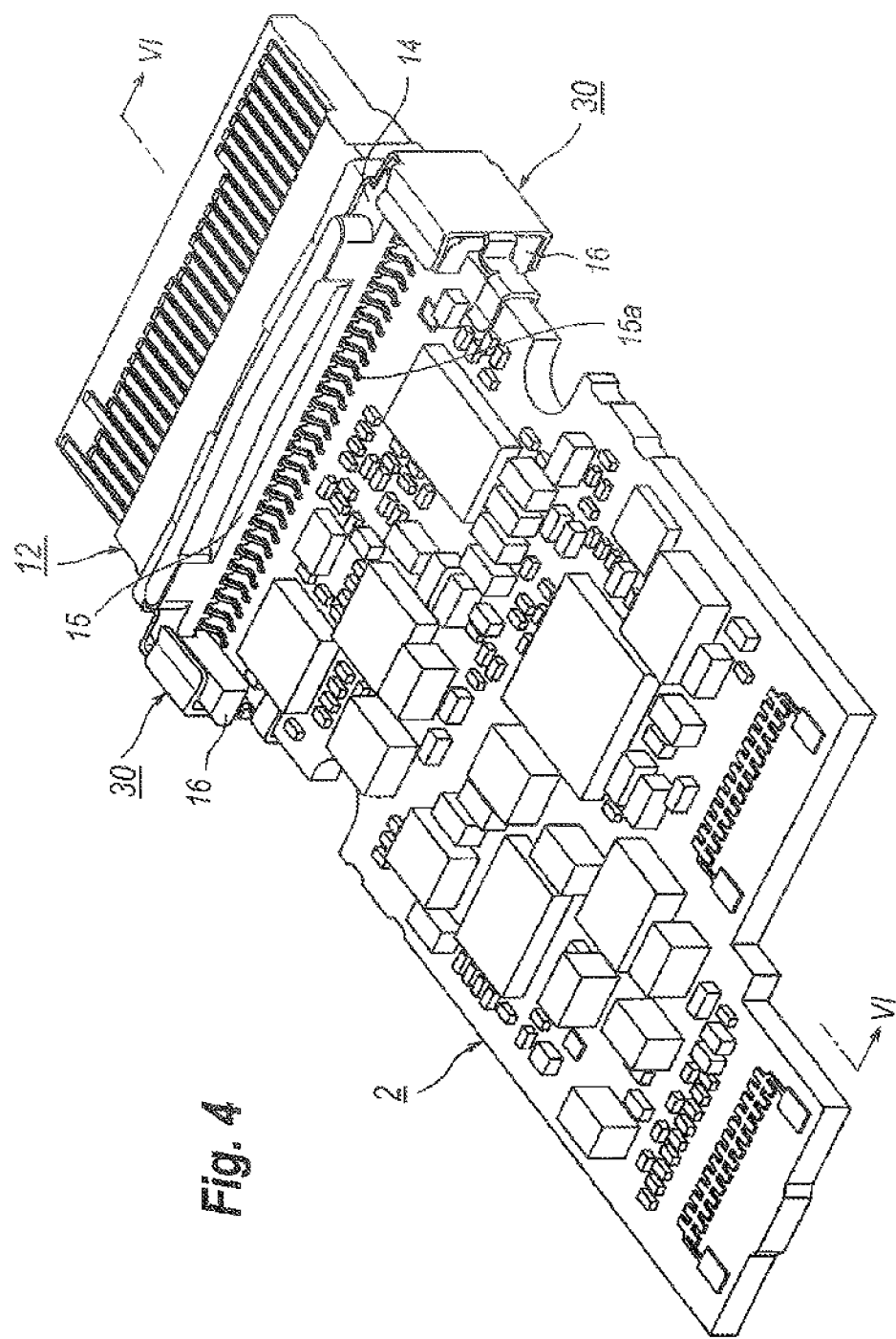
FIG. 4 is a perspective view of a circuit board and a plug board installed within the optical transceiver shown in FIG. 1.

FIG. 3 is a perspective view showing an inside of the optical transceiver 1 in upside down, which removes the bottom housing 5 from a status shown in FIG. 1. The optical transceiver 1, as shown in FIG. 4, installs the TOSA 6 and the ROSA 7 in the front portion 5a. The TOSA 6 encloses a light-emitting device, typically a semiconductor laser diode (LD) therein, and the ROSA 7 encloses a light-receiving device such as a semiconductor photodiode (PD). The TOSA 6 and the ROSA 7 are electrically connected with circuits mounted on the circuit board 2 through respective flexible printed circuit (FPC) boards, 6a and 7a.

The circuit board 2, which has dimensions of 20×60 mm$^2$, mounts the electronic circuits on top and back surfaces thereof. The electronic circuits include a driver to driver the LD in the TOSA 6 and a pre-amplifier to amplify a faint signal provided from the ROSA 7. An end of the circuit board continues to the plug board 12 by the holder 30. Setting the circuit board 2 in the holder 30, the solder reflow fixes the lead pins 15a provided in the holder to respective electrodes provided in the surfaces of the circuit board 2.

Respective ends of the TOSA 6 and the ROSA 7 receive external optical connectors through the optical receptacle 8. The top housing 4 arranges a slider 9 and a pull-tab 10 in both sides of the optical receptacle 8. These mechanisms of the slider 9 and the pull-tab 10 are provided for engaging the optical transceiver 1 with the cage of the host system, or releasing the optical transceiver 1 therefrom. Specifically, pulling the pull-tab 10 of the optical transceiver 1 plugged within the cage, the slider 9 co-works with the pull motion of the pull-tab 10 to release the engagement of the optical transceiver 1 with the cage. Thus, the optical transceiver 1 may be released from the cage.

FIG. 4 is a perspective view of the circuit board 2 assembled with the plug board 12. FIG. 4 removes the thermal sheet illustrated in FIG. 3 to show the top surface of the circuit board 2. The plug board 12, which is arranged in the rear end of the circuit board 2, is assembled with the circuit board 2 by soldering lead pins 15a with pads on the circuit board 2 after receiving the circuit board 2 in a receptacle 15 of a socket 14 of the plug card 12. The plug board 12 provides beams 16 in respective sides or the receptacle 15, where the beams 16 themselves support the circuit board 2. The holders 30 supports the circuit board 2 such that the circuit board 2 is in parallel to the plug board 12.

FIGS. 5A and 5B show the holder 30 to hold the circuit board 2 attached to the plug board, where FIGS. 5A and 5B illustrate the holder 30 in upside down. The optical transceiver 1 of the present embodiment provides two holders 30 putting the circuit board therebetween. The holder 30 illustrated in FIGS. 5A and 5B corresponds to that illustrated in the front side in FIG. 4. The holder 30, which may be formed by cutting and bending a metal slab without any welding and so on, comprises a first support 31, a second support 32, a stopper 33, and an arm 34, where these portions arranged from the side of the plug board 12 to the circuit board 2 in this order.

The second support 32 fits the circuit board 2 and provides a center plate 32a and top and bottom cramps, 32b and 32c, respectively. The second support 32 receives the circuit board 2 in a space surrounded by the center plate 32a and two cramps, 32b and 32c. The second support 32 continues to the first support 31 by an extension 32d with an L-shaped cross section.

The first support 31 also comprises a center plate 31a and two cramps, 31b and 31c, namely, the top cramp 31b and the bottom cram 31c. The first support 31 receives the side of the plug board 12. Because the plug board 12 has a thickness far greater than that of the circuit board 2, a space surrounded by the center plate 31a and two cramps, 31b and 31c, are wider than the space formed in the second support 32. The first support 31 further provides a stopper 33 in a site opposite to a side where the extension 32d extends toward the second support 32. Thus, the center plate 31a, two cramps, 31b and 31c, the stopper 33, and the extension 32d surround and support the beam 16 of the receptacle 15 of the plug board 12.

The holder 30 further comprises an arm 34 extending from an end of the stopper 33 by the extension 34a bent rearward by a right angle from the stopper 33. The arm 34 includes a root arm 34b continuous to the extension 34a and a top arm 34c. The former arm 34b, the root arm 34, shuts against the plug board 12 in a portion in the rear of the bottom rib 17. The top arm is elastically in contact to the bottom housing 5 in a portion between the rear opening 5d and the recess 5e.

The other holder 30 has a structure having the plane symmetry to those illustrated in FIGS. 5A and 5B. Supporting the plug board 12 by the pocket surrounded by the center plate 31a, two cramps, 31b and 31c, of the first support 31 and the stopper 33; the holder 30 may hold the circuit board 2 by the pocket surrounded by the center plate 32a and two cramps, 32b and 32c, in the second support 32. Thus, the circuit board 2 is assembled with the plug board 12.

Figure 6A:
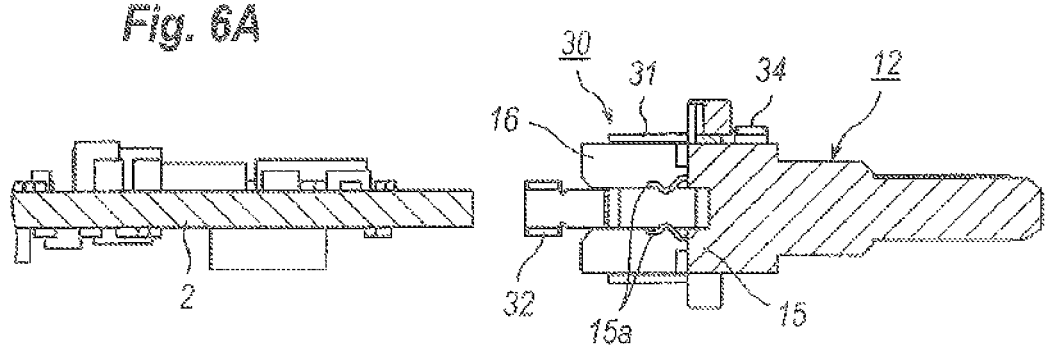
FIGS. 6A to 6C show processes to hold the circuit board and the plug board by the holder shown in FIGS. 5A and 5B.
Figure 6B:
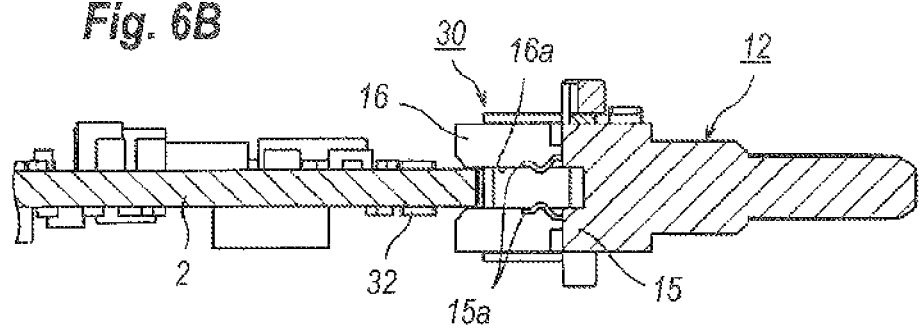
Figure 6C:
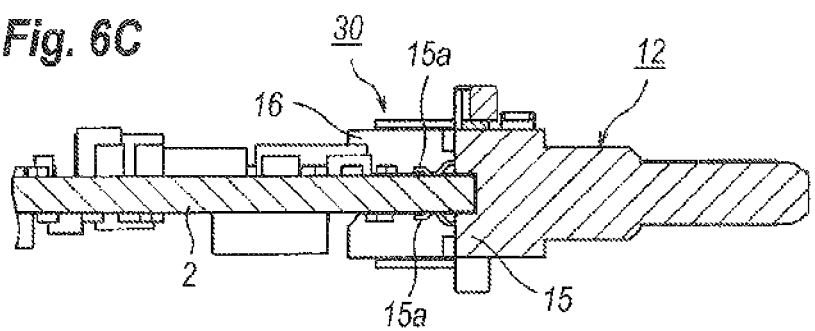
Figure 11:
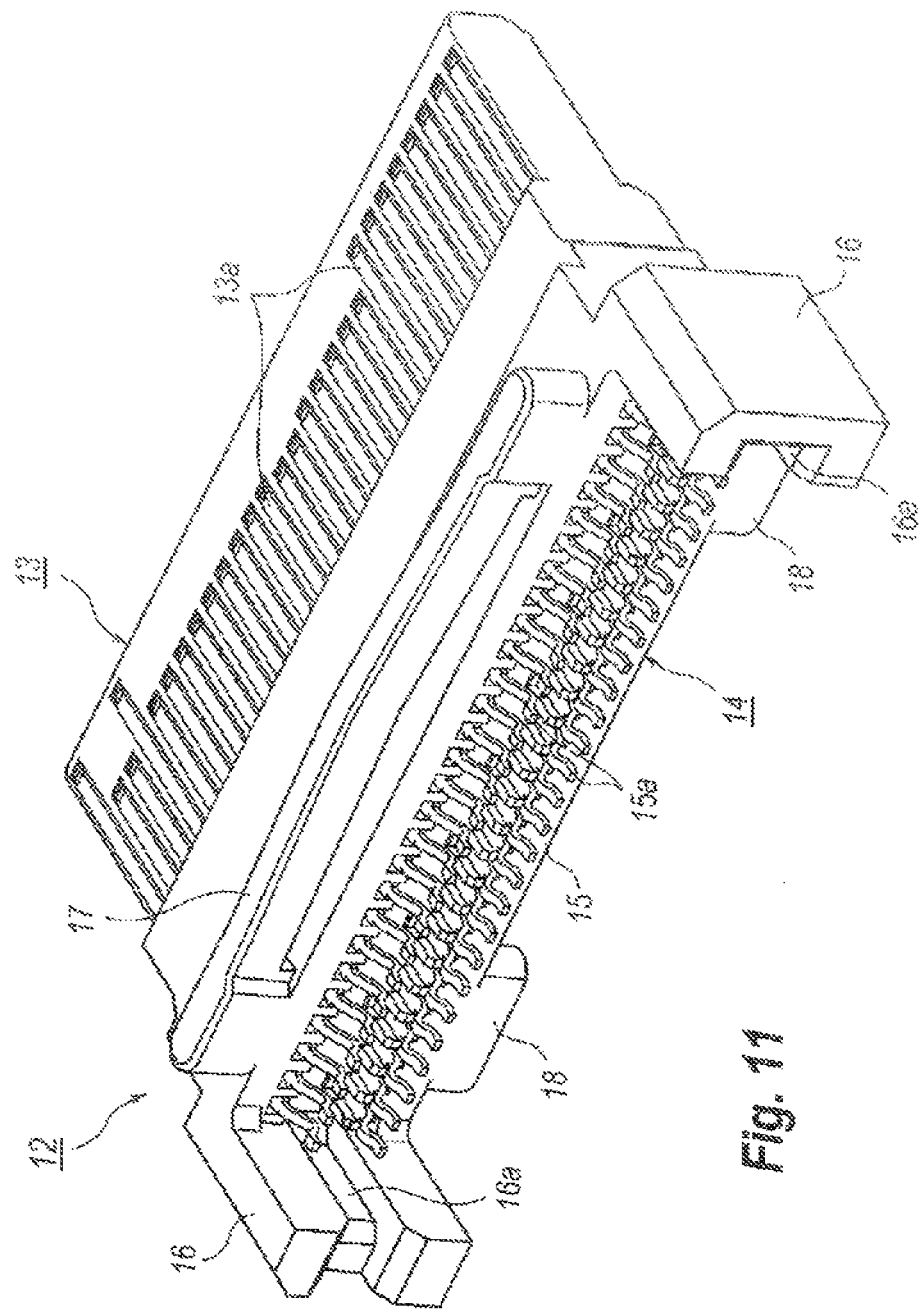
FIG. 11 is a perspective view of an example of the plug board.

FIGS. 6A to 6C show processes to hold the circuit board and the plug board by the holder shown in FIGS. 5A and 5B, where FIG. 6C is a cross section of the circuit board 2 assembled with the plug board 12 taken along the line VI-VI appearing in FIG. 4. As shown in FIG. 6A, preparing the plug board 12, which assembles the holder 30, and the circuit board 2, and inserting the circuit board 2 into the receptacle 15 of the plug board 12, not only the second support 32 of the holder 30 receives the circuit board 2 but the pocket 16a of the beam 16, which is indicated in FIG. 11, may receive the edge of the circuit board 2, as shown in FIG. 6B. Referring to FIG. 11, the plug board 12, which may be is made of resin, has a plug 13, a receptacle 15 and a beam 16. The plug 13 provides a plurality of pads 13a electrically connected with the host connector. The receptacle 15 provides a plurality of lead pins 15a and receives the edge of the circuit board 2. The lead pins 15a in the receptacle are soldered with pads provided in the circuit board 2 after the reception thereof by the receptacle 15. The beam 16 provides a pocket 16a in an inner side thereof to receive the side of the circuit board 2. During the process of the reflow soldering of the lead pins 15a with the pads on the circuit board 2, the circuit board 2 in respective sides thereof may be supported by the beam 16. However, the dimensions of the beam 16, in particular, those of the pocket 16a are defined in an MSA. When the circuit board 2 has a thickness less than a width of the pocket 16a, the circuit board 2 is unable to be tightly supported by the beam 16, or, the circuit board 2 is hard to be set on a level with the plug board 12. Referring back to FIG. 6C, further inserting the circuit board 2 between the lead pins 15a of the plug board 12 until the end of the circuit board abuts against the receptacle; the circuit board 2 may be securely held by not only the pocket 16a of the plug board 12 but the holder 30 to hold the circuit board on a level with the plug board 12.

Figure 7A:
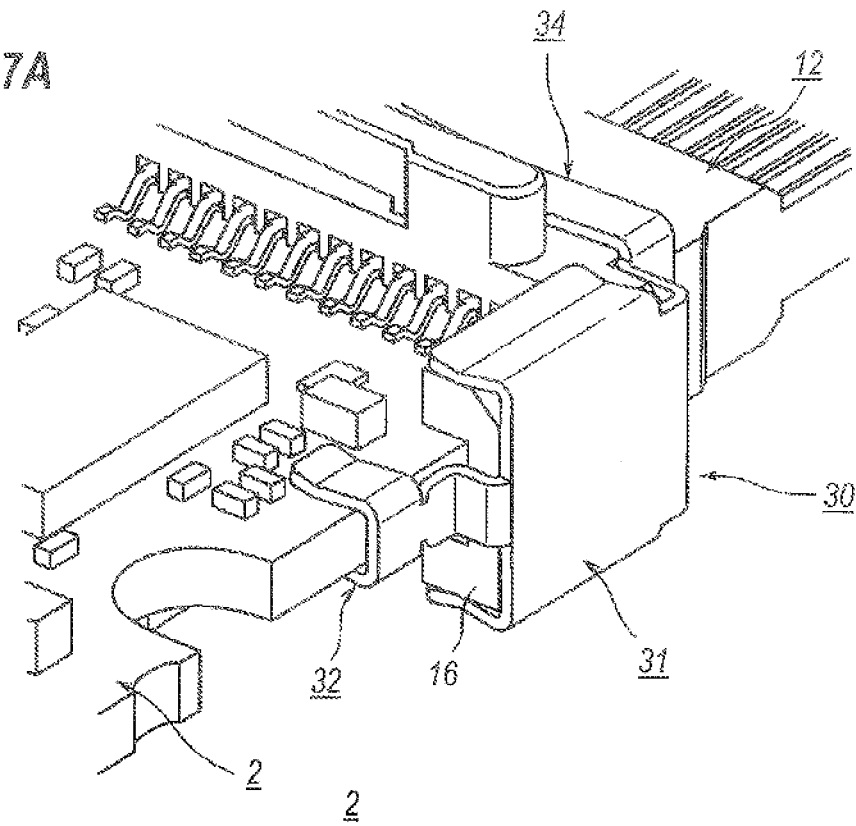
FIGS. 7A and 7B magnify arrangements around the holder.
Figure 7B:
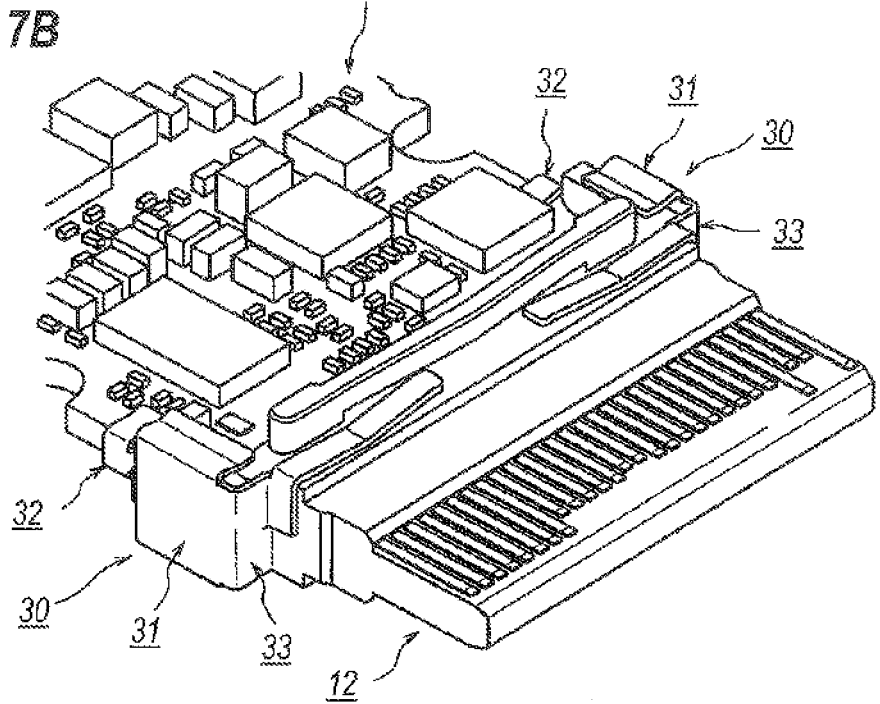

FIGS. 7A and 7B magnify arrangements around the holder 30. As shown in FIG. 7A, the first support 31 receives the beam 16 in the pocket formed by the center plate 31a, the top and bottom cramps, 31b and 31c, the stopper 33, and the extension 32d for the second support 32. Also, the second support 32 supports the circuit board 2 by cramping the edge thereof by the top and bottom cramps, 32b and 32c. Moreover, the stopper 33 may control the slide of the holder 30 in forward by abutting against the rear wall of the receptacle 16, which may secure the parallelism between the plug board 12 and the circuit board 2 until the position of the circuit board 2 against the plug board 2 is permanently determined, that is, until the lead pins 15a are soldered with the pads on the circuit board 2.

Figure 8:
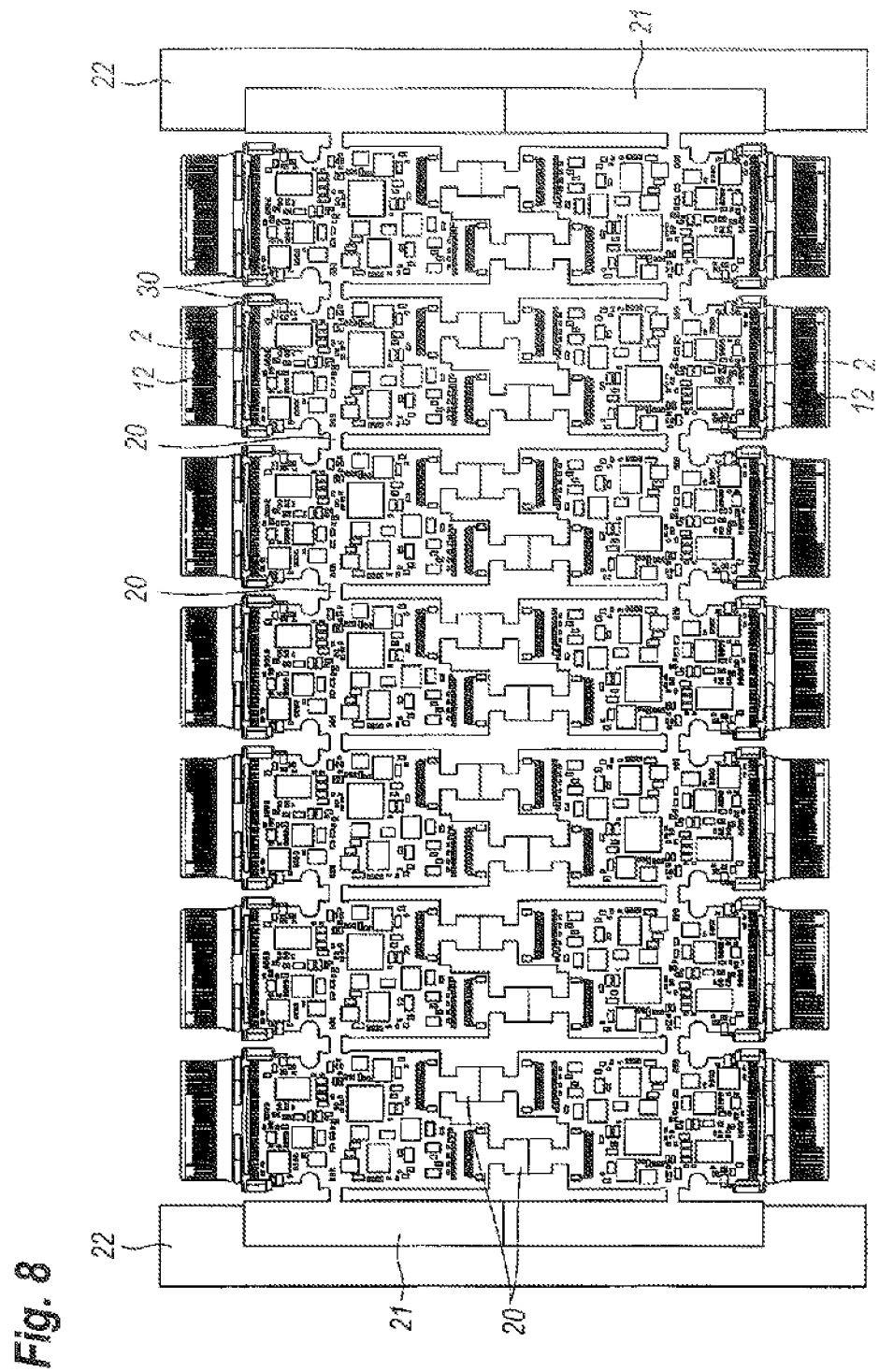
FIG. 8 explains a process or the soldering of the circuit board and the plug board.

FIG. 8 explains a process of the soldering of the circuit board and the plug board shown in FIG. 4. Specifically, an assembly subject to the reflow soldering includes fourteen (14) circuit boards mounting electronic components in advance to the soldering an tied by the tie bar 20. As described, after the holders 30 assemble the plug boards 12 with the circuit boards 2, the assembly shown in FIG. 8 is conveyed within the reflow furnace as being carried on a conveyor 22. Because the holder 30 supports the circuit board 2 to secure the level between two boards, 2 and 12, the soldering process may prevent two boards, 2 and 12, from deviating in the levels thereof.

Also, the holder 30 may not cause unnecessary stress to the soldered lead pins 15a, which may effectively prevent the lead pins 15a from breaking, or causing failures in electrical connections. Because solder pastes are applied only to the pads on the circuit board 2 and the lead pins 15a but not to the holder 30 at all, the holder 30, even when it is made of metal, may be not electrically conducted to the circuit board 2 and the plug board 12, which means that the holder 30 may be disassembled with the circuit board 2 and the plug board 12 after the reflow soldering.

Figure 10A:
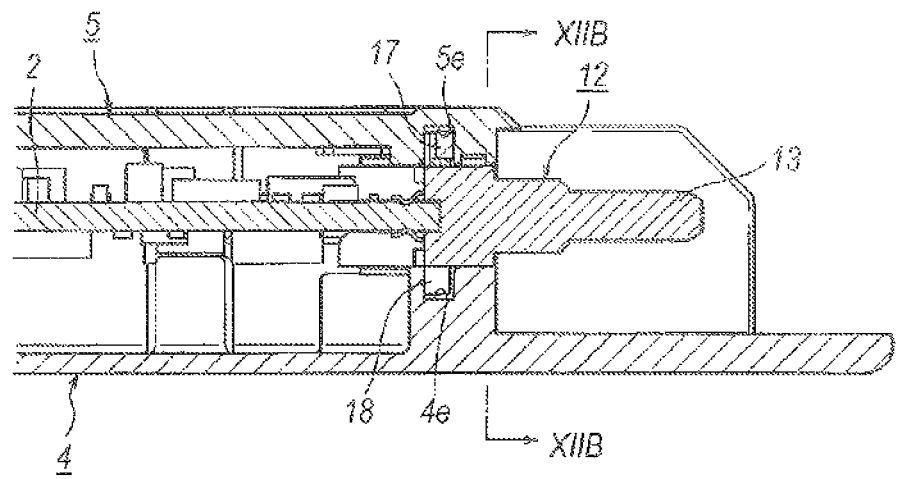
FIGS. 10A and 10B are cross sections around the holder taken along the longitudinal axis of the transceiver and a direction perpendicular to the longitudinal axis.
Figure 10B:
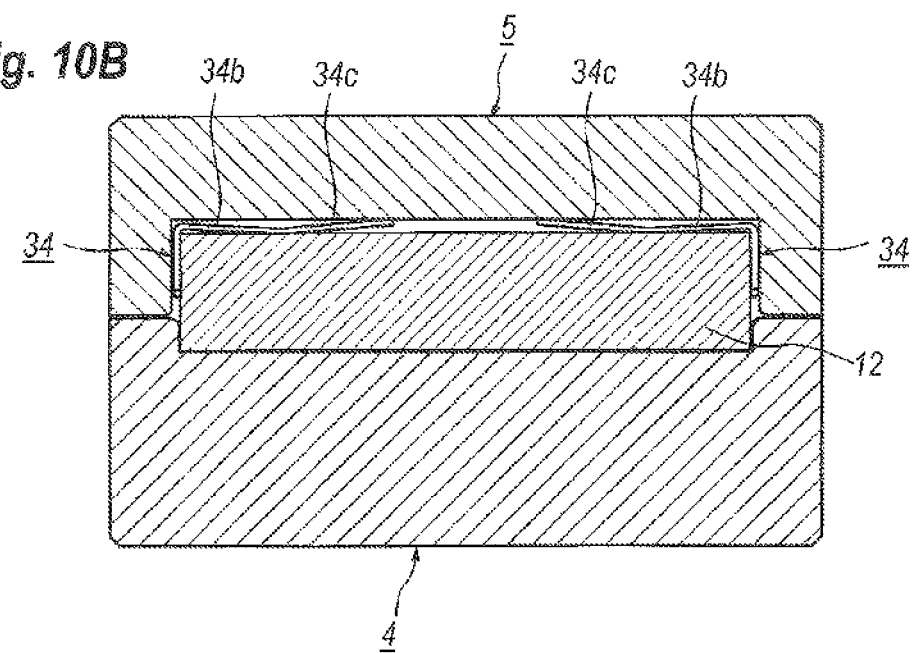

FIG. 9 describes the shielding mechanism around the holder, and FIGS. 10A and 10B are cross sections around the holder taken along the longitudinal axis of the transceiver and a direction perpendicular to the longitudinal axis. As shown in FIG. 9 the plug board 12 and the circuit board 2 are set within the top housing 4 as being assembled with the holder 30. As shown in the cross section shown in FIG. 10A, the top rib 18 is set within the recess 4e provided in the top housing 4 and a front wall of the top rib 18 comes in contact with the front wall of the recess 4e, which determines the position of the plug board 12 against the top housing 4, and may absorb the stress caused in the insertion of the plug board 12 into the host device.

After setting two boards, 2 and 12, within the top housing 4, the bottom housing 5 is assembled with the top housing 4 to enclose the circuit hoard 2 therein. As shown in FIG. 10A, the bottom rib 17 is set within the bottom recess 5e such that the rear wall of the bottom rib 17 is in contact with the rear wall of the bottom recess 5e, which also determines the position of the plug board 12 against the bottom housing 5. However, the top of the bottom rib 17 makes a gap against the bottom of the bottom recess 5e. This relation may be also reflected in the top rib 18 and the top recess 4e, but, the top rib 18 may be in contact with the bottom of the top recess 4e.

That is, dimensions of the top housing 4, the bottom housing 5, and the plug board 12, in particular, the top rib 18 and the bottom rib 17 thereof are designed such that the plug board 12 forms a gap against the bottom housing 5 even after the plug board 12 is assembled between the top and bottom housings, 4 and 5. However, as shown in FIG. 10B, the root arm 34b of the holder 30 is in contact with the plug board 12 and the top arm 34c is forced to be in contact with the bottom housing 5 between the plug board 12 and the bottom housing 5, which may effectively suppress or prevent the plug board 12 from rattling.

In the foregoing detailed description, the method and the apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An optical transceiver plugged within a cage that is provided in a host system, the host system providing a host connector in the cage, comprising:
  a circuit board that mounts an electronic circuit thereon;
  a plug board to be mated with the host connector of the host system, the plug board being assembled with the circuit board by soldering;
  a holder that holds the circuit board on a level with the plug board, the holder providing a first support and a second support, the first support supporting the plug board and providing a top cramp and a bottom cramp that put a side of the plug board therebetween, the second support supporting the circuit board and providing a top cramp and a bottom cramp that put a side of the circuit board therebetween; and
  a housing that installs the circuit board and the plug board therein, the housing including a top housing and a bottom housing assembled with the top housing, the top housing and the bottom housing securing a space where the circuit board is installed therein,
  wherein the holder provides an arm extending from the first support thereof, the arm providing a root arm and a top arm, the root arm abutting against the plug board, the top arm extending from the root arm and abutting against the bottom housing.

2. The optical transceiver of claim 1,
  wherein the plug board is made of resin, and includes a receptacle and a beam, the receptacle receiving the circuit board, the beam being provided in a side of the receptacle, the first support of the holder sandwiching the beam by the top cramp and the bottom cramp thereof.

3. The optical transceiver of claim 2,
wherein the first support further includes a stopper that abuts against a rear wall of the beam.

4. The optical transceiver of claim 2,
wherein the beam includes a pocket that receives the circuit board therein.

5. The optical transceiver of claim 4,
wherein the pocket has a width greater than a thickness of the circuit board.

6. The optical transceiver of claim 2,
wherein the receptacle of the plug board receives an end of the circuit board, and
wherein the lead pins are soldered with pads provided in the circuit board.

7. The optical transceiver of claim 1,
wherein the plug board includes a top rib and a bottom rib, the top housing including a top recess that receives the top rib of the plug board therein, and the bottom housing includes a bottom recess that receives the bottom rib of the plug board therein, and
wherein the top rib abuts against a top wall of the top recess, and the bottom rib abuts against a rear wall of the bottom recess.

\* \* \* \* \*